United States Patent [19]
Robinson

[11] Patent Number: 4,499,776
[45] Date of Patent: Feb. 19, 1985

[54] VACUUM SAMPLE INTRODUCTION UNIT

[75] Inventor: James E. Robinson, Burlington, Canada

[73] Assignee: UHV Instruments Ltd., Burlington, Canada

[21] Appl. No.: 472,130

[22] Filed: Mar. 4, 1983

[51] Int. Cl.³ .............................................. G01N 1/00
[52] U.S. Cl. ............................. 73/863.85; 73/864.82; 414/217
[58] Field of Search ........... 73/863.85, 864.81, 864.82; 414/217; 74/18.2

[56] References Cited

U.S. PATENT DOCUMENTS 3,742,772 7/1973 Makovec .............................. 74/18.2
3,832,904 9/1974 Dreuw et al. ..................... 73/863.85
4,115,736 9/1978 Tracy ................................. 324/73 R
4,308,756 1/1982 Robinson et al. ................ 73/864.82

Primary Examiner—S. Clement Swisher
Assistant Examiner—John E. Chapman, Jr.
Attorney, Agent, or Firm—Sim & McBurney

[57] ABSTRACT

A vacuum sample introduction device includes a roller bearing assembly which rigidly supports a probe rod for accurate reciprocation relative to the device.

6 Claims, 6 Drawing Figures

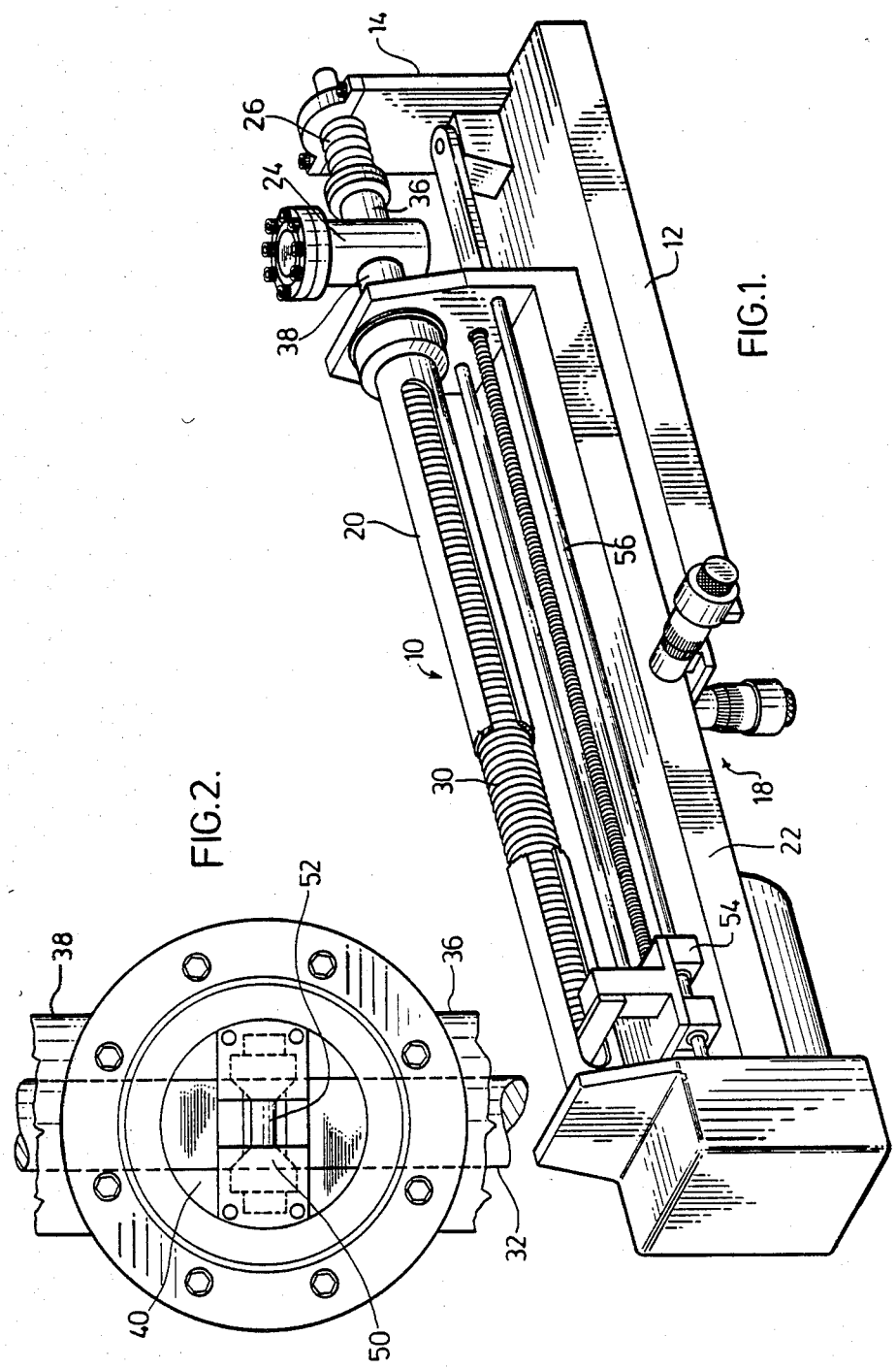

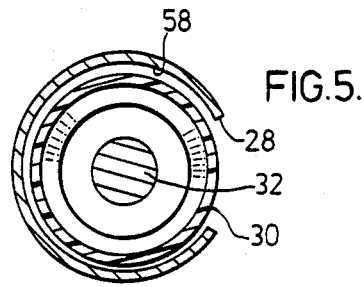
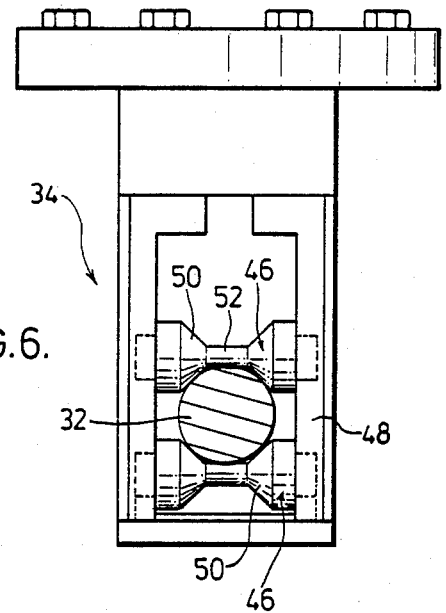

VACUUM SAMPLE INTRODUCTION UNIT

FIELD OF INVENTION

The present invention is directed to a vacuum sample introduction device, and in particular to a device for transferring sample holders or special samples into a high vacuum environment without the necessity for venting the main chamber to atmosphere.

BACKGROUND TO THE INVENTION

A device of the general type to which the present invention is directed is described in U.S. Pat. No. 4,308,756, the disclosure of which is incorporated herein by reference. In that prior art, a sample carrier bearing a sample for analysis first is loaded onto a carrying fork or probe through a port in an intermediate vacuum chamber while the loading device is isolated from the ultra high vacuum analysis chamber. Following closure of the sample introduction port, the intermediate chamber is pumped down to the ultra high vacuum range (less than $10^{-6}$ mm of mercury). An air lock valve located between the loading chamber and the main ultra high vacuum analysis chamber then is opened to establish communication between the chambers and the sample carrier. The loading fork is moved into the analysis chamber by extending an elongate probe arm to which the loading fork is mounted and may be manipulated to a position to deposit the sample carrier at any desired location in the analysis chamber. After so positioning the sample carrier, the probe arm and loading fork may be retracted from the analysis chamber and the air lock closed again.

SUMMARY OF INVENTION

In accordance with the present invention, the structure of U.S. Pat. No. 4,308,756 is improved by supporting the probe arm between upper and lower rollers adjacent and upstream of the intermediate chamber. The rollers impart stability and rigidity to the probe arm and permit improved reliability of operation.

BRIEF DESCRIPTION OF DRAWINGS

FIG. 1 is a perspective view of a sample loading apparatus constructed in accordance with one embodiment of the invention;

FIG. 2 is a close up plan view of the support bearing assembly used in the device of FIG. 1;

FIG. 5 is a sectional view of the apparatus of FIG. 1 taken on line 5—5 of FIG. 1; and FIG. 6 is a sectional view of the support bearing assembly taken on line 6—6 of FIG. 1.

DESCRIPTION OF PREFERRED EMBODIMENT

Figure 3:
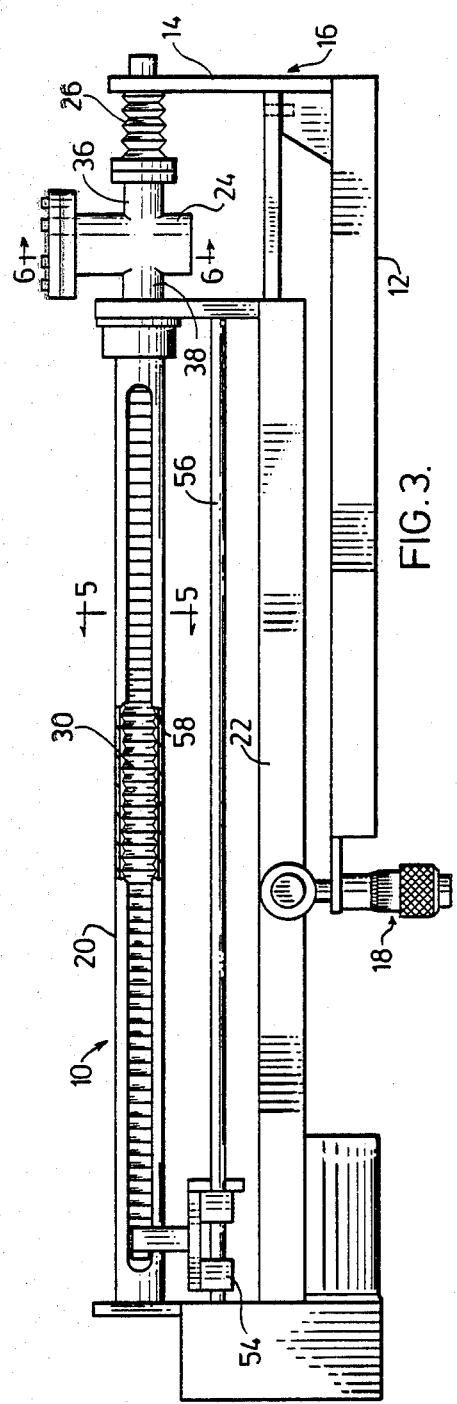
FIG. 3 is a side elevational view of the device of FIG. 1.
Figure 4:
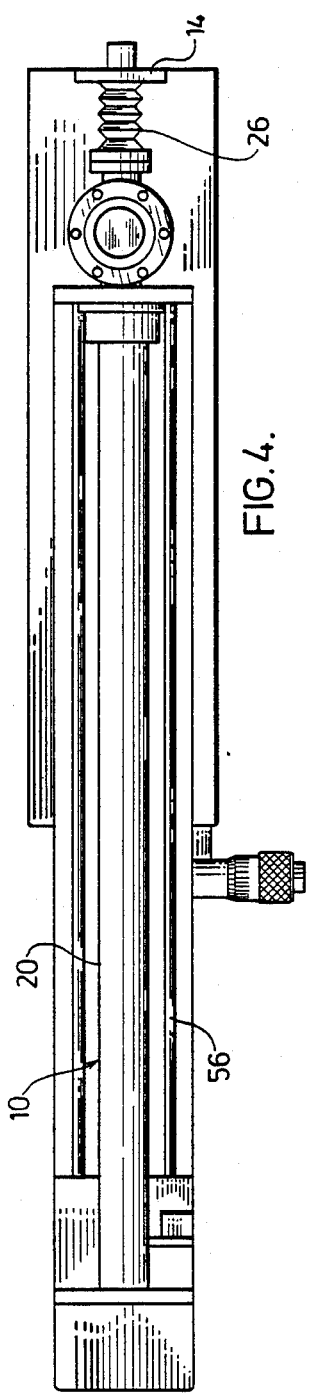
FIG. 4 is a top plan view of the sample loading apparatus of FIG. 1.

Referring to the drawings, there is illustrated therein a vacuum sample introduction unit 10, which is intended to be mounted to a five-way cross intermediate vacuum chamber, as described in U.S. Pat. No. 4,308,756. The vacuum sample introduction unit 10 includes an elongate rigid mounting frame 12 supporting the various elements of the unit 10, which are pivotally mounted to the mounting frame 12 to an upright flange 14 at the forward end 16 of the mounting frame 12 for movement thereof about both a vertical and a horizontal axis relative to the mounting frame. An X-Y axis movement mechanism 18 is connected between the mounting frame 12 and the other elements of the unit 10 to effect the movement thereof in a vertical and/or a horizontal direction. The pivotal mounting and the manner of achieving X-Y axis movement may be as described in U.S. Pat. No. 4,308,756.

The unit 10 comprises an elongate tubular member 20 mounted to a frame 22, a bearing housing 24 and a bellows assembly 26 between the bearing housing 24 and the upright flange 14. The elongate tubular member 20 has an elongate slot 28 extending along one side thereof and a compressible bellows 30 is received in sliding relation within the tubular member 20. The interior of the bellows 30 communicates with the bearing housing 24.

An elongate probe rod 32 is located centrally within the compressible bellows 30, is mounted at one end to the enclosed end of the bellows 30 and is supported within the bearing housing 24 by a roller bearing assembly 34 described in more detail below. The probe rod 32 is reciprocable between the retracted position shown in FIG. 1, wherein it extends a short distance through an end opening in the bellows assembly 26 and an extended position.

The end opening is intended to communicate with an intermediate vacuum chamber to which samples may be introduced and removed, as described in U.S. Pat. No. 4,308,756. The intermediate vacuum chamber communicates with an ultra high vacuum environment, such as an analysis chamber, through a suitable gate valve and extension and retraction of the probe rod 32 enables samples to be moved between the intermediate vacuum chamber and the ultra high vacuum environment. If desired, the end opening may communicate directly with the ultra high vacuum environment, through a suitable valve, although this arrangement is less beneficial.

The bearing housing 24 includes axially-aligned arms 36 and 38, which establish communication between a chamber 40 enclosed within the bearing housing 24 and the bellows 26 and 30.

Located in the chamber 40 is the roller bearing assembly 34 which supports the probe rod 32 in the bearing housing 24. The roller bearing assembly 34 comprises upper and lower roller bearings 46 which are mounted to a frame member 48 to enclose the probe rod 32 therebetween. Each bearing 46 comprises truncated conical portions 50 joined by a cylindrical portion 52, all of which engage the external surface of the probe rod 32. The probe rod 32 is rigidly but slidably held by the roller bearings 46.

The compressible bellows 30 is compressed by the motion of a pusher assembly 54 mounted on mounting rods 56 during extension of the probe rod 32 into the ultra high vacuum environment. The interior surface of the tube 20 is provided with a dry lubricant coating 58, such as TEFLON (Trademark), to decrease wear on the external surfaces of the compressible bellows 30 during reciprocation of the probe rod 32 under the influence of the pusher assembly 54.

OPERATION

In operation of the loading device 10, the device 10 is mounted to an intermediate vacuum housing for receipt and removal of vacuum samples. The intermediate housing in turn is connected to an ultra high vacuum analysis or chamber or the like via a gate valve, as described in more detail in U.S. Pat. No. 4,308,756. With the gate valve closed, the unit 10 and the intermediate chamber are isolated from the ultra high vacuum analysis chamber. The interior of the unit 10 is at atmospheric pressure.

A sample carrier is mounted on a loading fork of any convenient construction located on the end of the probe rod 32 in the intermediate housing. When the sample loading port has been closed, a vacuum pump connected to the vacuum pumping port of the intermediate vacuum chamber is operated to evacuate the interior of intermediate vacuum chamber and thereby the interior of the device 10, until a pressure in the ultra high vacuum range is achieved. The gate valve then is opened to establish communication between the analysis chamber and the intermediate vacuum chamber. It is unnecessary for the vacuum in the intermediate vacuum chamber and the device 10 to precisely match that of the analysis chamber in view of the relatively small interior volume of the intermediate vacuum chamber as compared with that of a typical analysis chamber.

The pusher assembly 54 then is activated to cause the compressible bellows 30 to compress by sliding in relation to the interior of the tube 20 and to cause the probe rod 32 to move into the analysis chamber for location of the sample carrier at a desired location. The X-axis and Y-axis positions of the sample carrier in the analysis chamber may be varied by appropriate manipulation of the mechanism 18.

After deposition of the sample carrier at the desired location in the vacuum chamber, the probe rod 32 may be retracted by reverse movement of the pusher assembly 54. The gate valve then may be closed until a further sample carrier needs to be introduced into or retracted from the analysis chamber.

During motion of the probe rod 32 into and out of the analysis chamber, the roller bearing assembly 34 rigidly supports the probe rod 32 and enables the sample carrier to be accurately positioned in the analysis chamber.

The vacuum sample introduction device 10 when assembled with an intermediate vacuum chamber, as described in U.S. Pat. No. 4,308,756, therefore, permits the transfer of sample carriers into and out of an ultra high vacuum environment without the necessity for pumping the environment down to the desired vacuum level each time a transfer is required. The sample is initially positioned in a chamber of comparatively small volume which can be rapidly and simply evacuated to a vacuum approximating that of the ultra high vacuum environment into which the sample is to be introduced. A gate valve between the small volume chamber and the analysis chamber then is opened and the sample inserted into the analysis chamber. Fine positioning and release from the probe rod can be achieved by external X- and Y-axis adjustments. During movement of the sample between the load position and analysis position, the probe rod is rigidly yet slidably held by a bearing assembly to achieve accurate sample loading and unloading.

SUMMARY OF DISCLOSURE

In summary of this disclosure, the present invention provides a vacuum sample introduction device of improved construction which imparts added stability to the probe rod and improved bellows operation. Modifications are possible within the scope of this invention.

What I claim is:

1. A sample loading device for loading samples into and unloading samples from an ultra high vacuum environment, which comprises:
    an elongate rigid frame member,
    an elongate housing assembly mounted to said frame member for pivotal movement relative thereto about a vertical axis and relative thereto about a horizontal axis,
    means for effecting said pivotal movement about said horizontal axis and about said vertical axis,
    elongate smooth-surfaced cylindrical probe rod means located in said elongate housing assembly and mounted for forward movement through an opening at one end of said housing from a retracted position to an extended position and rearward movement from said extended position to said retracted position, whereby said probe rod means may be used to effect said sample loading and unloading,
    said elongate housing assembly including compressible bellows means supported within an elongate hollow tube, said probe rod means being located within, surrounded by and mounted to said compressible bellow means, roller bearing means located in said housing close to said end opening therefrom and rigidly supporting said probe rod means from movement other than longitudinally thereof, and
    means for effecting said forward and rearward movement of said probe rod means while being supported by said roller bearing means, said movement effecting means comprising said compressible bellows means whereby compression of said bellows means towards said end opening by said movement effecting means effects forward movement of said probe rod means from said retracted position and expansion of compressed bellows means away from said end opening effects rearward movement of said probe rod means to said retracted position.

2. The device of claim 1 wherein said hollow tube has lubricated internal walls engaging the apices of said bellows.

3. The device of claim 1 wherein said roller bearing means comprises upper and lower roller bearings mounted in engagement with the probe rod.

4. The device of claim 3 wherein each said roller bearing comprises spaced truncated conical portions joined by a cylindrical portion.

5. A sample loading device for loading samples into and unloading samples from an ultra high vacuum environment, which comprises:
    an elongate rigid frame member,
    an elongate housing assembly mounted to said frame member for pivotal movement relative thereto about a vertical axis and relative thereto about a horizontal axis,
    means for effecting said pivotal movement about said horizontal axis and about said vertical axis,
    elongate smooth-surfaced cylindrical probe rod means located in said housing assembly and mounted for forward movement through an opening at one end of said housing assembly from a retracted position to an extended position and rearward movement from said extended position to said retracted position, whereby said probe rod means may be used to effect said sample loading and unloading,
    said elongate housing assembly comprising:

a tubular housing enclosing said probe rod means, said tubular housing being closed at one end and open at the other, a bearing housing rigidly mounted to said tubular housing and communicating with the open end of the tubular housing, said bearing housing enclosing and housing roller bearing means which rigidly support said probe rod means from movement other than longitudinally thereof, and flexible bellow means extending and establishing communication between said vacuum environment and said bearing housing, and means for effecting said forward and rearward movement of said probe rod means while being supported by said roller bearing means.

6. The device of claim 5 wherein said tubular housing comprises a rigid tube and a compressible bellows assembly mounted in slidable relation with the internal wall of the rigid tube.

* * * * *